United States Patent [19]
Farina

[11] 4,261,055
[45] Apr. 7, 1981

[54] ELECTRONIC TUNING CIRCUIT ARRANGEMENT FOR DIRECT AND INDIRECT STATION SELECTION USING A MEMORY CIRCUIT

[75] Inventor: Attilio Farina, Turin, Italy

[73] Assignee: Indesit Industria Elettrodomestici Italiana, S.p.A., Rivalta, Italy

[21] Appl. No.: 47,846

[22] Filed: Jun. 12, 1979

Related U.S. Application Data

[63] Continuation-in-part of Ser. No. 922,882, Jul. 7, 1978, abandoned, which is a continuation of Ser. No. 738,065, Nov. 2, 1976, abandoned.

[30] Foreign Application Priority Data

Nov. 17, 1975 [IT] Italy .................... 69823 A/75

[51] Int. Cl.³ ............................................. H04B 1/16
[52] U.S. Cl. ................................. 455/158; 455/165; 455/183; 455/186
[58] Field of Search ............... 455/165, 183, 185, 186, 455/158; 358/191.1, 192.1

[56] References Cited

U.S. PATENT DOCUMENTS

| | | | |
|---|---|---|---|
| 3,961,261 | 6/1976 | Pflasterer | 455/165 |
| 3,968,440 | 7/1976 | Ehni | 455/186 |
| 4,081,752 | 3/1978 | Sumi | 455/183 |
| 4,123,724 | 10/1978 | Das et al. | 455/183 |

Primary Examiner—Jin F. Ng
Attorney, Agent, or Firm—Ladas & Parry

[57] ABSTRACT

A circuit arrangement for selecting the tuning of a radioelectric signal in a signal receiving set, in particular a television set, comprises a memory circuit having a plurality of cells for storing in digital form information relating to a plurality of tunable signals with means in the circuit arrangement for sequentially scanning the cells of the memory circuit and for obtaining the stored information for the desired selection of a receiving signal.

13 Claims, 3 Drawing Figures

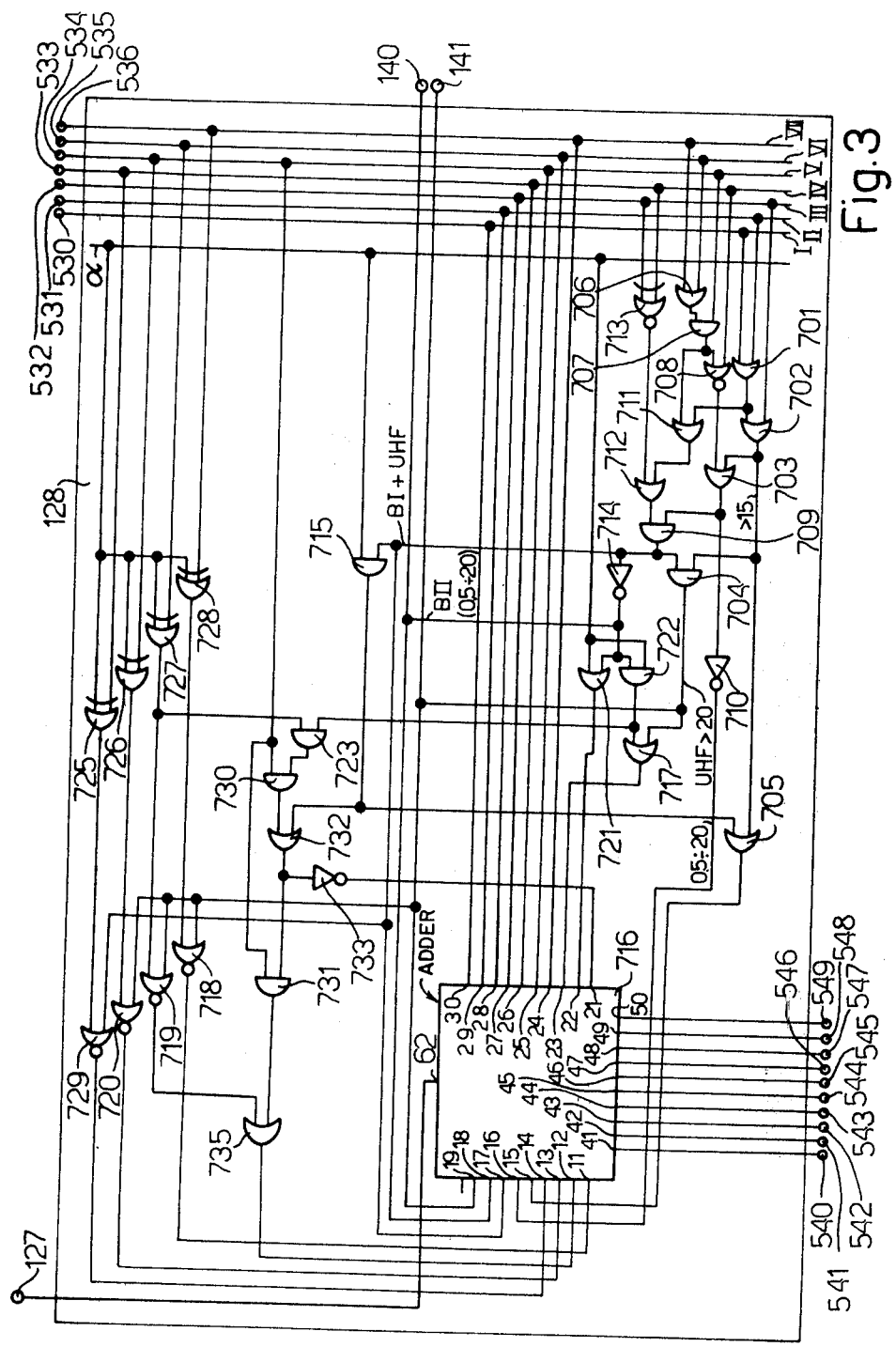

ELECTRONIC TUNING CIRCUIT ARRANGEMENT FOR DIRECT AND INDIRECT STATION SELECTION USING A MEMORY CIRCUIT

This is a continuation-in-part of my copending application Ser. No. 922,882 filed July 7, 1978 now abandoned, which was a continuation of my application Ser. No. 738,065 filed Nov. 2, 1976 (abandoned).

BACKGROUND OF THE INVENTION

This invention relates to a circuit arrangement for the selection of one among a plurality of radioelectric signals receivable in a signal receiving set, particularly television signals, comprising a memory circuit in which information relating to a plurality of tunable signals can be stored in digital form. A circuit arrangement of this type is described in copending U.S. patent application Ser. No. 729,757 filed on Oct. 5, 1976 in the name of Mario Malerba and of common assignment herewith.

Such circuit arrangement, applied, for example, to a television set, comprises a voltage controlled oscillator (VCO) whose output signal has a frequency determined by a control loop as a function of a number N different for each one of the frequencies of the selectable signals and obtained from a memory circuit. To select a frequency of a television channel, the number of the channel is set, for example, by means of a push button panel having ten push buttons numbered from 0 to 9, as that of a pocket calculator, and is sent as an address to the memory circuit which substantially produces the number N corresponding to the frequency to be selected. In this way, it is possible to select directly any one of 100 tunable channels, by forming a number of two figures from 00 to 99 on the push button panel. Moreover, it is possible to apply to the tuning thus obtained, which is the theoretical tuning, a manual correction by means of two further push buttons, which determines a variation of the less significant digits of the number N. Thus, it is possible to store in one of the cells of a second memory circuit the information for forming the number N, which is relative to the tuned channel, and to correlate it to a chosen one of the ten push buttons of the panel, so that it will then be possible to read out the ten stored channels with the tunings already corrected.

SUMMARY OF THE INVENTION

It is an object of the present invention to provide an improved electronic tuning circuit arrangement which, by adding a further possibility of selection of stored channels, ameliorates the convenience of tuning for the user.

It is also an object of the invention to provide for the above object to be attained in a very economical way by utilizing devices already existing in the circuit of the receiving set.

A further object of the present invention is to provide an electronic tuning circuit arrangement for a signal receiving set, in particular a television set, comprising a memory circuit having a plurality of cells for storing in digital form information relating to a plurality of tunable signals; and means for sequentially scanning the cells of the memory circuit and for obtaining the stored information for the desired selection of a tunable signal.

BRIEF DESCRIPTION OF THE DRAWINGS

For a better understanding of the invention, it will now be described in detail with reference to the accompanying drawings given by way of example and in which:

FIGS. 2 and 3 respectively show in detail the control unit and processing unit depicted as blocks in FIG. 1.

DETAILED DESCRIPTION OF THE INVENTION

Figure 1:
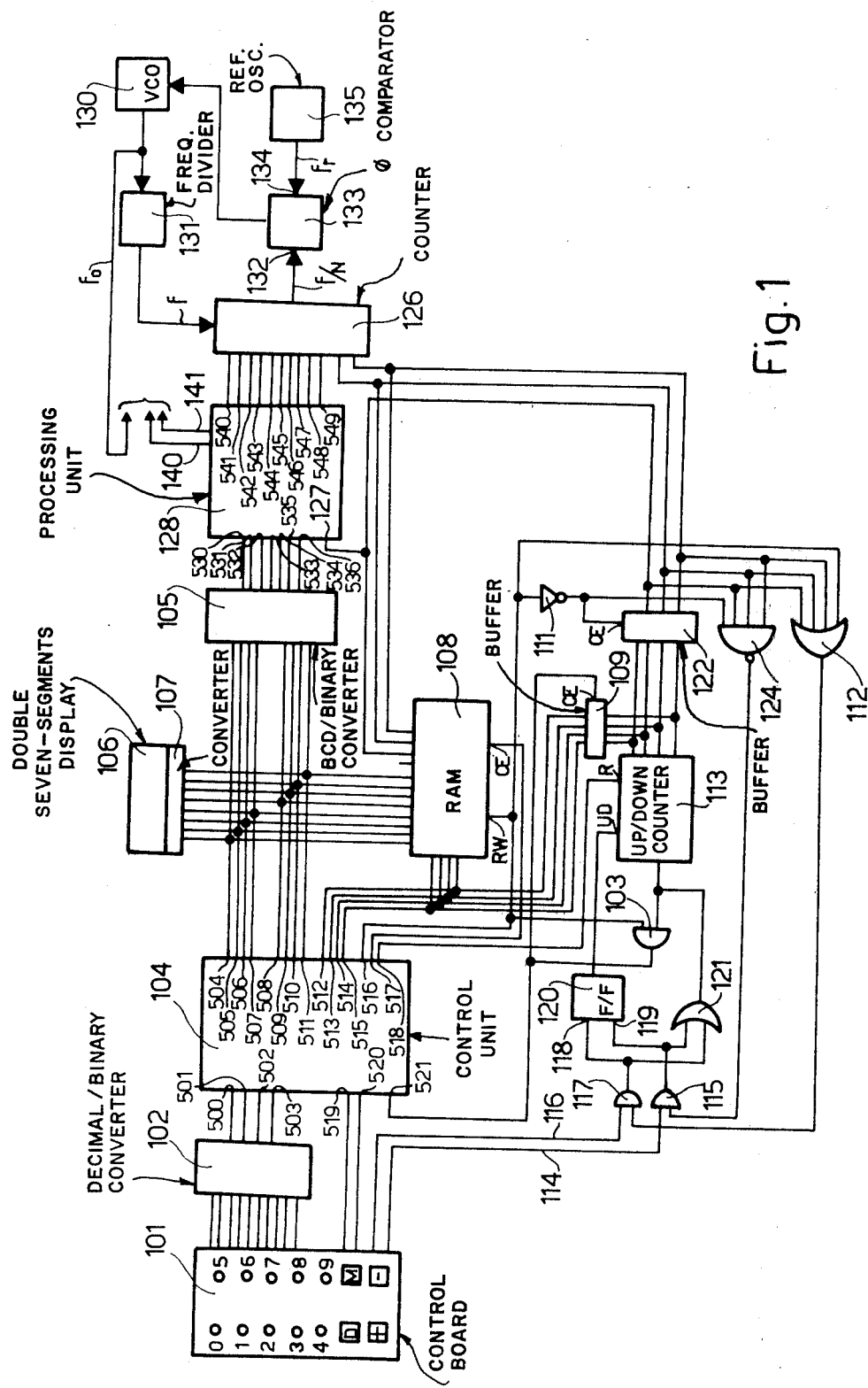
FIG. 1 shows a diagram of a circuit arrangement for a digital control tuner in a television signal receiving set, embodying the principles of the present invention.

In FIG. 1, there is diagramatically shown a control board 101 having ten push buttons or touch sensors numbered from 0 to 9, and having, moreover, four additional push buttons or sensors distinguished by the indications D, M, +, −.

Each of the ten push buttons numbered from 0 to 9 is connected to the input of a decimal-binary converter logic circuit 102 having four output conductors on which the information corresponding to the number of the actuated push button appears in binary code.

These four conductors, together with two conductors connected to the push buttons D and M and with a further output conductor from an AND gate 103, arrive at respective inputs 500, 501, 502, 503, 519, 520 and 521 of a control unit 104 comprising a plurality of logic circuits which operate on the input signals in a manner to be described later. Unit 104 may be of the type described in the aforementioned copending U.S. patent application Ser. No. 729,757 and it possesses fifteen outputs 504–518, the first eight (504–511) of which are connected to the inputs of:

a circuit converter 105, converting the data in BCD code into data in binary code, which converts into a single binary number (of seven bits) two binary numbers (of four bits each) which it receives, giving to them the respective weight;

a double seven-segments display 106, through a double binary-seven segments converter 107; and to eight of the twelve inputs-outputs of a RAM (Random Access Memory) 108 having ten memory cells of twelve bits and preferably of the non-volatile type.

The subsequent four outputs 512–515 of the control unit 104 are connected to four address inputs of RAM 108 to which are also connected four outputs of a separator (or buffer) circuit 109 which has an enabling input CE (Chip Enable) connected to the output of gate 103. Separator circuit 109 may conveniently be represented by four AND gates.

The remaining three outputs 516–518 of control unit 104 are connected:

the first: to an input of AND gate 103, to the read-write (R/W) input of RAM memory 108, to the input of an inverting gate 111 and finally to an input of an OR gate 112 having four inputs;

the second: to the enabling input CE of RAM memory 108;

the third: to the reset input R of a four bit counter 113 capable of counting up and down, from zero to nine.

The push button + of control board 101 is connected, through a conductor 114, to an input of an AND gate 115; the push button − is connected, through a conductor 116, to an input of an AND gate 117. The outputs of the gates 115 and 117 are connected to two inputs SET 118 and RESET 119 of a bistable multivibrator 120 and also to the two inputs of an OR gate 121. One output of multivibrator 120 is connected to a count inversion input U/D (UP-DOWN) of counter 113; the output of gate 121 is connected to the second input of gate 103 and to the clock input of counter 113. The four outputs of counter 113 are connected both to the inputs of separator circuit 109 and to the inputs of another identical separator circuit 122. Circuit 122 has an enabling input CE which is connected to the output of inverting gate 111, which output is connected also to an input of a four input NAND gate 124.

Separator circuit (or buffer) 122 has three outputs (of which one, which corresponds to the most significant input, is free) which are connected to the remaining inputs both of gate 112 and of gate 124. The output of NAND gate 124 is connected to the second input of AND gate 115; the output of OR gate 112 is connected to the second input of AND gate 117.

The three outputs of buffer 122 are connected also to three of the remaining inputs-outputs of RAM 108. The two less significant outputs of buffer 122 are connected also to two (the less significant) of twelve inputs of a twelve bit binary counter-divider 126; the third output of buffer 122 is also connected to an input 127 of a processing unit 128 which comprises a plurality of logic circuits and an adder circuit and whose operation will be described later. Processing unit 128 may conveniently be of the type described in my copending U.S. patent application Ser. No. 735,564 filed on Oct. 26, 1976 and of common assignment herewith. The seven outputs of converter circuit 105 are connected to as many inputs 530–536 of processing unit 128 which has ten outputs 540–549 connected to the remaining ten most significant inputs of counter 126. A voltage controlled oscillator (VCO) 130 supplies to the tuner (not shown) a local frequency oscillation $f_o$ for frequency conversion and supplies this local oscillation also to a frequency divider (or prescaler) 131 which divides in the ratio 1:256.

At the output of divider 131, there is present a frequency oscillation f which arrives as a clock signal at counter 126 which produces a frequency signal f/N, where N is the number in binary code which is present at the twelve inputs of counter 126. The output of counter 126 is connected to a first input 132 of a phase comparator 133 which has a second input 134 which receives from a circuit 135 of well-known type a frequency reference oscillation $f_r$. Circuit 135 may comprise, for example, a line frequency oscillator, tuned by line synchronism pulses, followed by a frequency divider circuit which divides, for example, in the ratio 1:16.

The output of comparator 133 is connected to the input of oscillator 130, and it controls the frequency $f_o$ so that:

$$f/N = f_r$$

and consequently, with the hypotheses assumed:

$$f_o = 256\, N f_r \quad (1)$$

The processing unit 128 has another two outputs 140 and 141 which supply to the tuner the informations relative to band change.

Figure 2:
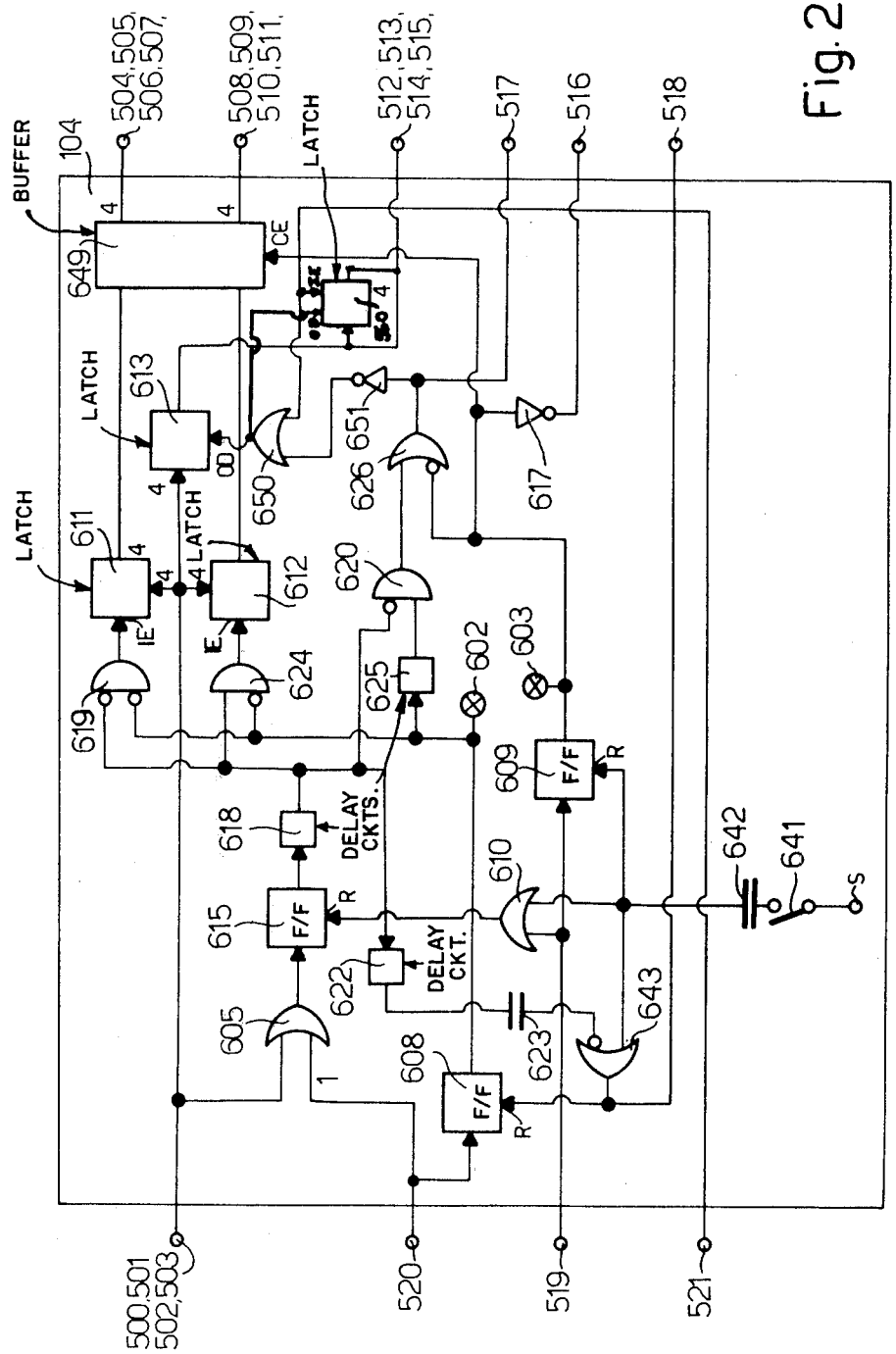

Control unit 104 of FIG. 1 is shown in detail in FIG. 2, and it represents a part of the circuit disclosed in the aforementioned copending U.S. patent application Ser. No. 729,757. In the diagrammatic representation of FIG. 2, the groups of conductors which follow the same path of connection are shown by a single line, by the side of which a numeral indicates how many conductors the group contains; where no numeral is present, it means that the line is formed by a single conductor.

The inputs 500, 501, 502, 503 of control unit 104 are connected through four conductors to inputs of three identical latches, indicated in FIG. 2 by reference numerals 611, 612 and 613, each of which is provided with four inputs and with an enabling input IE (Input Enable). The outputs of latches 611 and 612 are connected, through two lines of four conductors each, and through a separator circuit (or buffer 649) to the two groups of four outputs of circuit 104, respectively 504, 505, 506, 507 and 508, 509, 510, 511.

The inputs 500, 501, 502 and 503 are also connected to inputs of an OR gate 605. The input 520 is connected to a further input of the gate 605 and to an input of a bistable multivibrator (flip-flop) 608 provided with a reset input R. The input 519 is connected to an input of a bistable multivibrator (flip-flop) 609 and to an input of an OR gate 610 having two inputs.

The output of gate 605 is connected to the input of a bistable multivibrator (flip-flop) 615 provided with a reset input R, this latter being connected to the output of the gate 610. Multivibrator 615, as well as multivibrators 608 and 609, have two outputs, one of which is at the opposite logic level of the other. For simplicity of representation, only one output is shown in FIG. 2; however, it can be seen that said output arrives sometimes to negative inputs of gates or to inverter circuits, such as that indicated by reference numeral 617. It is clear that, actually, the corresponding circuits are connected to the negative output of the respective multivibrator.

Thus, the negative output of multivibrator 615 is connected through a delay circuit 618 to:
 one input of an AND gate 619 having two inputs;
 one input of an AND gate 620 having two inputs;
 and, through an additional delay circuit 622, to a differentiator circuit 623.

The positive output of multivibrator 615 is, in turn, connected to an input of an AND gate 624 having two inputs, also through a delay circuit 618 (the delay circuit 618, instead of being disposed at the outputs, may be disposed at the input of multivibrator 615).

The positive output of multivibrator 608 is connected to:
 a light source 602, for illuminating the push button M
 and, through a delay circuit 625, to the other input of the AND gate 620.

The delay circuits 618, 625 and 622, which produce a time delay equal to $\tau_1$, $\tau_2$ and $\tau_3$ respectively, are such that $\tau_1 < \tau_2 < \tau_3$.

The negative output of multivibrator 608 is connected:
 to the other input of AND gate 619, and to
 the other input of AND gate 624.

The outputs of gates 619 and 624 are connected to enabling inputs IE of latches 611 and 612, respectively.

The output of AND gate 620 arrives at an input of an OR gate 626 having two inputs.

The positive output of multivibrator 609 is connected to:

a light source 603, for illuminating the push button D; and to the enabling input CE of the buffer 649.

The negative output of multivibrator 609 is connected to:

the other input of gate 626; and through the inverter 617, to the output 516.

The output of gate 626 is connected to the output 517 and, through an inverter 651, to an input of an OR gate 650; the output of latch 613 is connected, through a four conductor line, to the outputs 512, 513, 514 and 515.

A terminal S which receives the external supply voltage is connected, through a switch 641 of the receiving set, to a differentiator circuit 642 whose output is connected:

to the reset input R of multivibrator 609;

to the other input of gate 610; and to an input of an OR gate 643 having two inputs.

The other input of gate 643 is connected to the output of differentiator circuit 623; the output of gate 643 is connected to the reset input R of multivibrator 608 and to the output 518. The input 521 is connected to the other input of gate 650. The output of gate 650 is connected to an output disable terminal OD of latch 613.

The processing unit 128 is shown, in detail, in FIG. 3, and it represents a part of the circuit disclosed in the aforementioned copending U.S. patent application 735,564. The seven inputs 530, 531, 532, 533, 534, 535 and 536 are connected to seven wires indicated by I, II, III, IV, V, VI and VII.

Wires I and II are connected to the inputs of an OR gate 701 whose output, together with a connection from wire III, is connected to the inputs of an OR gate 702. The output of OR gate 702 is connected to an input of an OR gate 703, to an input of an AND gate 704 and to an input of an OR gate 705. Wires VI and VII are connected to the two inputs of an OR gate 706 whose output, together with a connection from wire V, is connected to the two inputs of an AND gate 707. The output of this AND gate 707, together with a connection from wire IV, is connected to the two inputs of a NOR gate 708 whose output is connected to the other input of OR gate 703. The output of OR gate 703 is connected both to an input of an AND gate 709, and to an inverter 710. The output of AND gate 707 is connected also to an input of an OR gate 711, the other input of which having connected thereto the output of OR gate 701. The output of OR gate 711 is connected to an input of an OR gate 712, the other input of which has connected thereto the output of an exclusive NOR gate 713 whose two inputs are connected to the wires III and IV. The output of OR gate 712 is connected to the other input of AND gate 709. The output of AND gate 709 is connected to the other input of AND gate 704, to the input of an inverter 714, to an input of an AND gate 715, to an input of a NOR gate 729 and to an input 17 of an adder 716 which effects the addition of a first addend of nine binary digits, which it receives at inputs numbered from 11 to 19, with a second addend of ten binary digits which it receives at inputs numbered from 21 to 30. The output of AND gate 704 is connected to an input of an OR gate 717, to an input of NOR gates 718, 719 and 720 respectively, and to the input 19 of adder 716. The output of inverter 714 is connected to an input of an OR gate 721, to an input of an AND gate 722 and to the input 18 of adder 716. The other input of gates 721 and 722 is connected to a wire to which is applied a signal at logic level "0". The output of the AND gate 722 is connected to the other input of the OR gate 717 and to an input of an AND gate 723.

The wire α is connected also to an input of exclusive OR gates 725, 726, 727 and 728 respectively. Gate 725, whose other input is connected to the wire IV, has its output connected to the other input of NOR gate 729. Gate 726, whose other input is connected to the wire V, has its output connected to the other input of gate 720. Gate 727, whose other input is connected to the wire VI, has its output connected to the other input of gates 719 and 723. Gate 728, whose other input is connected to the wire VII, has its output connected to the other input of gate 718. The wire V is connected to an input of two AND gates 730 and 731 respectively. Gate 730, whose other input is connected to the output of gate 723, has its output connected to an input of an OR gate 732, whose output is connected to the other input of gate 731 and to the input of an inverter 733. Connected to the other input of gate 715 is the wire α, and the output of gate 715 is connected to the other input of OR gates 705 and 732. The output of gate 718 is connected to the input 11 of adder 716. The outputs of gates 719 and 731 are connected to the two inputs of an OR gate 735, whose output is connected to the input 12 of adder 716. The output of gate 720 is connected to the input 13 of adder 716. To the inputs 14, 15 and 16 of adder 716 are connected, respectively, the outputs of NOR gate 729, of OR gate 705 and of inverter 710. To the inputs 21, 22 and 23 of adder 716 there are connected the outputs of inverter 733, of OR gate 721 and of OR gate 717, respectively. The inputs from 24 to 30 of adder 716 are connected, respectively, to the wires VII, VI, V, IV, III, II and I.

Adder 716 has ten outputs, indicated progressively by reference numerals 41 to 50, which are respectively connected to the ten outputs (540, 541, 542, 543, 544, 545, 546, 547, 548, 549) of processing unit 128.

The input 127 is connected to an additional input 62 of adder 716.

The outputs of inverter 714 and of gate 704 are respectively connected to outputs 140 and 141.

The operation of the circuit arrangement of FIG. 1 will now be explained.

Control unit 104 comprises a plurality of logic circuits which operate on the various input signals so as to supply, in the various stages of operation which will be listed, the following levels of the output signals:

(I)—At the switching on of the receiving set:

"zero" on all the first twelve outputs 504–515;

"one" on the thirteenth output 516 (the RAM memory 108 therefore disposes itself to be "read", and the buffer circuit 122 is disabled);

"one" on the fourteenth output 517 (the RAM memory 108 is enabled);

a pulse on the fifteenth output 518, which pulse causes the output of the counter 113 to assume the value which has been set and which is equal to four.

In fact, at the moment of switching on the receiving set, by means of the switch 641, the three multivibrators 608, 609 and 615 are reset by means of differentiator circuit 642 and gates 610 and 643, and the outputs of said three multivibrators become "zero" level (reference is made here, as well as hereinafter, unless otherwise stated, to the normal, not negative, outputs), so that the circuit arrangement is prepared for indirect selection as will be better explained later. For accomplishing indirect access by switching on the receiving set, however, it is assumed that memory 108 has been pre-loaded by the user with the desired channels. It will, however, be useful to initiate the explanation by referring to the operation on direct station selection.

(II)—By actuating the push button D and then a couple of numbered push buttons of the control board 101 (for example the one with the digit 1 and then the one with the digit 2), whereby the signals corresponding to said two digits arrive at the control unit 104 successively, through the converter 102;

the digit (in binary code) which corresponds to the first numbered push button which has been actuated (i.e. 1) appears on the first four outputs 504–507;

the digit (in binary code) which corresponds to the second numbered push button which has been actuated (i.e. 2) appears on the second four outputs 508–511; moreover, there is:

"zero" on the third group of four outputs 512–515;

"zero" on the thirteenth output 516 and fourteenth output 517 (the memory RAM 108 is disabled and the buffer circuit 122 is enabled);

a reset pulse on the fifteenth output 518, which pulse causes the output of the counter 113 to assume the value of +4.

In fact, by pressing push button D of panel 101, a "one" signal is produced at input 519. Accordingly, multivibrator 609, which has been reset at the moment of switching on the receiving set, changes state and its output becomes high, thereby producing the switching on of light source 603, the signal "zero" at output 516, and the signal "zero" at output 517. Actually, gate 620 has an input at low level (the one connected to the output of multivibrator 608 through delay circuit 625) and, accordingly, gate 626 has both inputs at low levels. Then, when the number of the channel to be selected is formed (in this case, the number 12), the user presses first the push button having the numeral 1 and then the push button having the numeral 2 (should he want to select a channel having a number less than 10, it is necessary to form 01, 02, etc.). The corresponding signals in binary code arrive at inputs 500 ... 503 of control unit 104, and the output of multivibrator 615, which is reset by pressing push button D, becomes high level when the push button bearing the numeral 1 is pressed, and returns to low level when the push button bearing the numeral 2 is pressed.

After having pressed push button D, the latch 611, after the time $\tau_1$ has elapsed, becomes enabled and therefore receives in binary code the number 1 from inputs 500 ... 503 of control unit 104, but after elapsing of the time $\tau_1$ from the moment at which the push button having numeral 1 has been pressed, latch 611 is disabled and latch 612 is enabled and thus receives the number 2.

Therefore, the numbers 1 and 2 appear, in binary codes, at the outputs 504 ... 507, and 508 ... 511 respectively, the buffer 649 being enabled.

After the time $(\tau_1 + \tau_3)$ has elapsed, a pulse appears at output 518 (through differentiator circuit 623 and gate 643). The signal "zero" at the output of gate 626, through gate 650, produces a "one" signal at input OD of latch 613 which disables the outputs of latch 613 which remain at level "zero".

At this point, oscillator 130 is caused by the loop formed by circuits 131, 126, 133 and 130 to supply an oscillation frequency $f_o$ given by the relation (1), i.e. at the theoretical frequency required for receiving channel 12. In fact, processing unit 128 receives the number 12 in binary code from converter 105, and moreover, counter 113 supplies the number four. Processing unit 128, through buffer circuit 122 which is enabled, receives therefore an additional "1" at the input 127; and processing unit 128, which supplies a number suitable for each channel, supplies at its outputs 540–549 for channel 12 the number 263 (see the following Tables I and II) which arrives in binary code at the ten most significant inputs of counter 126.

TABLE I

| BAND | EUROPEAN CHANNELS (K) | $f_o$(MHz) |
|---|---|---|
| I | 02 | 87 |
|  | 03 | 94 |
|  | 04 | 101 |
| III | 05 | 214 |
|  | 06 | 221 |
|  | 07 | 228 |
|  | 08 | 235 |
|  | 09 | 242 |
|  | 10 | 249 |
|  | 11 | 256 |
|  | 12 | 263 |
|  | ... | ... |
|  | 20 | 319 |
| UHF | 21 | 510 |
|  | 22 | 518 |
|  | 23 | 526 |
|  | 24 | 534 |
|  | ... | ... |
|  | ... | ... |
|  | 67 | 878 |
|  | 68 | 886 |
|  | 69 | 894 |

TABLE II

| Channel (k) | Code | 1st Addend inputs 11... | 2nd Addend inputs 21... | input 62 | Outputs 41...($f_o$) |
|---|---|---|---|---|---|
| 3 | 03 | 0001000100 | 0000011001 | 1 | 94 |
| 10 | 10 | 0010100101 | 0001010011 | 1 | 249 |
| 12 | 12 | 0010100011 | 0001100011 | 1 | 263 |
| 18 | 18 | 0010011101 | 0010010011 | 1 | 305 |
| 21 | 21 | 0101010000 | 0010101101 | 1 | 510 |
| 69 | 69 | 0101010000 | 1000101101 | 1 | 894 |

Counter 126 results therefore in being set (since it receives also two "zeroes" from buffer circuit 122) to divide by $N = 263 \times 4 = 1052$. For the relation (1) it results thus, if $f_r = 15625/16 = 976.5625$ Hz;
$f_o = 256 \times 976.5625 \times 1052 = 263 \times 10^6$ Hz which, assuming the intermediate frequency of the receiving set to be calibrated for a value of 38.75 MHz, is just the theoretical frequency of oscillator 130 which is necessary to receive channel 12 whose video carrier has the frequency of 224.25 MHz.

Let us see now how one gets the value of adder 716 to be equal to frequency $f_o$.

At wires I ... VII of processing unit 128 are applied, from inputs 530 ... 536, signals representing in binary code (0-1) the number 12, the signal on wire VII being of the less significant digit, while that on wire I is of the most significant digit.

Referring to FIG. 3, it can be seen that the circuit formed by logic OR gates 701 and 702 supplies a signal at level 1 for all those circuits whose number is greater than 15; the further circuit formed by OR gate 706, AND gate 707, NOR gate 708, OR gate 703, and by inverter 710 supplies, in combination with the preceding circuits, a signal at level 1 for channels whose number is between 5 and 15; the circuit formed by gates NOR exclusive 713, or 711, OR 712 and AND 709 and by inverter 714 supplies, in combination with the preceding circuits, a signal at level 1 for the channels having a number between 5 and 20; finally, AND gate 704 supplies, in combination with the preceding circuits, a signal at level 1 for all those channels whose number is greater than 20. All this will be clearly apparent from the following Table III.

TABLE III

| Output gates: | Output gate signal at high level (1) produced by input signals on wires I, II, III, IV, V, VI VII determined by the selection of channels: | Input of adder 716 connected to output gate |
|---|---|---|
| 701 | 32 to 99 | |
| 702 | 16 to 99 | |
| 703 | 0 to 4; 16 to 99 | |
| 704 | 21 to 99 | 19 |
| 705 | 16 to 99 | 15 |
| 706 | 1 to 3; 5 to 7; 9 to 11; 13 to 15; 17 to 19; 21 to 23; and so on. | |
| 707 | 5 to 7; 13 to 15; 21 to 23; 29 to 31; 37 to 39; and so on. | |
| 708 | 0 to 4; 16 to 20, 32 to 36; 48 to 52; and so on. | |
| 709 | 0 to 4; 21 to 99 | 17 |
| 710 | 5 to 15 | 16 |
| 711 | 5 to 7; 13 to 15; 21 to 23; 29 to 99 | |
| 712 | 0 to 7; 13 to 15, 21 to 99 | |
| 713 | 0 to 7; 24 to 31; 48 to 55; 72 to 79; 96 to 99 | |
| 714 | 5 to 20 | 18 |
| 715 | — | |
| 717 | 21 to 99 | 23 |
| 718 | even channels from 0 to 20 | 11 |
| 719 | 0, 1, 4, 5, 8, 9, 12, 13, 16, 17, 20 | |
| 720 | 0 to 3; 8 to 11; 16 to 19 | 13 |
| 721 | 5 to 20 | 22 |
| 722 | — | |
| 723 | — | |
| 725 | 8 to 15; 24 to 31; 40 to 47; and so on. | |
| 726 | 4 to 7; 12 to 15; 20 to 23; 28 to 31; 36 to 39; and so on. | |
| 727 | 2, 3, 6, 7, 10, 11, 14, 15, 18, 19, 22, 23, and so on. | |
| 728 | odd channels | |
| 729 | 5 to 7; 16 to 20 | 14 |
| 730 | — | |
| 731 | — | |
| 732 | — | |
| 733 | 0 to 99 | 21 |
| 735 | 0, 1, 4, 5, 8, 9, 12, 13, 16, 17, 20 | 12 |

It has to be noted that, with the hypotheses which have been made and with reference to Table I, which is an internationally established table setting forth for each channel number a predetermined value of frequency assigned for the video carrier, the frequency $f_o$ is bound to the number K of the television channel by the following relations, for the various ranges:

BI (channels 2 to 4):
$f_o = 73 + 7K = [64 + (7-K)] + [8K+1] + 1$

BIII (channels 5 to 15):
$f_o = 179 + 7K = [160 + (15-K)] + [8K+3] + 1$

BIII (channels 16 to 20):
$f_o = 179 + 7K = [144 + (31-K)] + [8K+3] + 1$

UHF (channels 21 to 99):
$f_o = 342 + 8K = [336] + [8K+5] + 1$

Said relations, for the various ranges of tunable signals, are seen to be of the type $f_o = M + RK$, where R is a number indicative of the channel's step frequency in a predetermined range and M is indicative of a basic value of frequency which has to be fixed in said range. These relations, which give the value of $f_o$, are not calculated directly in the circuit, but are obtained by calculating the second expressions comprising the terms shown above in square brackets. It should be noted also that for multiplying a binary number by eight it is sufficient to add three zeroes to it, and that the expressions $(7-K)$; $(15-K)$; $(31-K)$ are obtained from the last three or four inverted digits of the number K expressed in binary code, as shown by the following examples (the last three digits in band I, the last four digits in band III)

| K = 3 = 011 | 7-K = 4 = 100 |
|---|---|
| K = 10 = 1010 | 15-K = 5 = 0101 |
| K = 18 = 10010 | 31-K = 13 = 1101 |

If the first expression between square brackets of the relations written hereinabove is sent to the inputs 11 to 19 of adder 716 and the second expression between square brackets is sent to the inputs 21 to 30 of adder 716, there remains to be added only the digit outside the square brackets, which is always 1, and it is added on the additional input 62. The first expression between square brackets, which is of the type $(P-K)$ for the European VHF channels and P for the channels in UHF, is formed and sent to the inputs 11 to 19 in the following manner.

The number P is obtained from a series of logic gates, as will be explained hereinafter; the term $-K$ or zero is obtained by connecting wires IV, V, VI and VII (which correspond to the four less significant digits of the number K) to the four less significant inputs of the left-hand side of adder 716, i.e. 11, 12, 13 and 14 through the four OR exclusive gates 725, 726, 727 and 728 and through the four NOR gates 729, 720, 719 and 718. Said NOR gates act as inverters (to obtain the minus sign for the European channels in the VHF range). As can be seen from FIG. 3, OR gate 729 is blocked in the UHF range and in Band I (in which three digits only have to be inverted). The other three gates 718, 719 and 720 are blocked in the UHF range, so that in the UHF range at the inputs 11, 12, 13 and 14 of adder 716 there arrive four zeroes.

The second expression between square brackets, which is of the type $[8K+S]$, is obtained in a simple way by connecting the seven most significant inputs of the right hand side of adder 716, i.e. from 24 to 30, to the seven wires I-VII corresponding to the seven digits of the number K of the channel, and by connecting the remaining three inputs 21, 22 and 23 to logic gates for obtaining the number S (which is always less than 8).

The annexed Table II summarizes the functions of adder 716 on six European channels taken as an example.

Observing Table II, it can be seen that the first digit (starting from the right) of the second addend is always 1, said first digit is obtained by means of AND gates 730, 723 and 715, OR gate 732 and inverter 733. The second digit of the second addend is 1 in Band III, this being obtained by means of OR gate 721. The third digit is 1 in UHF; this is obtained by means of AND gate 722 and OR gate 717. In the first addend, the fifth digit is 1 in the channels over 15, which is obtained by means of OR gate 705; the sixth digit is 1 in the channels between 5 and 15, which information is already available from inverter 710; the seventh digit is always 1, except in Band III, while the eighth digit, instead, is 1 in Band III (such information being available upstream and downstream of inverter 714); the ninth digit is 1 in the UHF range and is obtained by means of AND gate 704.

Moreover, inverter 714 supplies a signal at level "1" when the selected channel is in Band III of the VHF range, and said signal is available at output 140; while the output of AND gate 704 supplies a signal at level "1" when the selected channel is in the UHF range, and said signal is available at output 141. The signals at outputs 140 and 141 are supplied to the tuner of the receiving set for controlling its band switch-over members. Processing unit 128 is also suitable for use with a tuner designed to recieve the signals of American television channels instead of European ones, as American channels are spaced by a 6 MHz step both in VHF and in UHF. Thus, the expressions of $f_o$ are all of the type $f_o = T + 6K$, where T is a fixed number, which expressions are obtainable easily by breaking the factor 6 into (4+2), i.e. $f_o = T + 4K + 2K$, and where it is clear that to multiply by two in binary code it is sufficient to add a zero, and to multiply by 4 it is sufficient to add two zeroes; or, it is possible to obtain the factor 6 as (8-2), and so on.

Therefore, it is sufficient to send the signals representing said number K to a first counter whose least significant input receives a zero and to a second counter having two least significant inputs each of which receives a zero and then add to the binary signals representing said number T the binary outputs of the first and second counters.

At this point the set is therefore tuned to the theoretical frequency corresponding to channel 12.

If it is desired to effect a correction of the tuning, it is sufficient to press the push button + or the push button − of control panel 101. By pressing the push button +, a signal arrives at AND gate 115, which is enabled by the output at level "1" of NAND gate 124, so that counter 113 increases the count by one unit, i.e. the output passes from four to five. By pressing the push button −, a signal arrives at AND gate 117, which also is enabled by the output at level "1" of OR gate 112, and counter 113 shifts down the output by one unit, i.e. passes to three. Therefore, through buffer 122, the output of the counter, varied by one unit, arrives at processing unit 128 and at counter 126, whereby the number N correspondingly increases or decreases by one unit. As a result, the frequency $f_o$ increases or decreases by 0.25 MHz.

Gates 115, 117, 112 and 124 prevent counter 113 from rising above 7 and from dropping below zero, to avoid sudden jumps of tuning. In fact, with the output of counter 113 at the value 7, the output of NAND gate 124 passes to the value "0", so that gate 115 is blocked, thereby inhibiting the action of further pulses on connection 114 to increase the count.

When, instead, the output of counter 113 is at the value zero, the output of OR gate 112 passes to "0" and gate 117 is blocked, thereby inhibiting the action of further pulses on connection 116 to reduce the count.

(III)—If now one actuates push button M and then a numbered push button (for instance, the push button 3), control unit 104, which receives the signals, supplies in output:

on the first group 504–507 and second group 508–511 of four outputs, always the same digit as before, i.e. 1 and 2 respectively;

on the third group 512–515 of four outputs, the digit corresponding to the last push button actuated, i.e. 3;

"zero" on the thirteenth output 516 (buffer circuit 122 is enabled) and also on the fifteenth output 518 (the output of counter 113 is not varied);

"one" on the fourteenth output 517 (memory 108 is enabled to be "written").

More particularly, on pressing push button M, there is produced a signal at input 520, the light source 602 is switched on, the enabling inputs of latches 611 and 612 are disabled and, after the time $\tau_2$, the output of gate 620 becomes at level 1 together with output 517, as soon as the output of multivibrator 615 becomes at its low level again. Moreover, the output of multivibrator 615 becomes at its high level as soon as the push button M has been pressed and after having pressed the push button which bears the numeral 3, the number 3 is stored in latch 613 (always enabled) and after the time $\tau_1$ has elapsed (to ensure that latch 613 is charged), output 517 becomes at level 1, there being "zero" at input OD of latch 613 so that the number 3 appears at outputs 512 . . . 515.

The number 12, which arrives at the first eight inputs of memory 108, is therefore stored at the address three, the number 3 arriving from control unit 104 at the address inputs of memory 108, and moreover, by means of the last three inputs of memory 108, there is stored the number which corresponds to the tuning correction (for example, the number five, if the push button + has been pressed once before starting the storage stage).

When, after a suitable period of time, memory 108 has stored said information, the last seven outputs 512–518 of control unit 104 automatically return to zero, so that memory 108 is disabled, and moreover there is a pulse on the fifteenth output 518 for restoring the output of counter 113 on the present value of four.

More particularly, after a time $(\tau_1 + \tau_3)$, there is a pulse at output 518, and multivibrator 608 is reset (through differentiator circuit 623 and through gate 643), light source 602 is extinguished to indicate that the storage has been accomplished and, after a further time $\tau_2$, the output of gate 626 returns to "zero" as does output 517 and the signal at input OD of latch 613, which brings to zero the outputs 512–515.

At this point, if a different pair of numbered push buttons of control panel 101 is pressed, the receiving set is thereby tuned to the corresponding frequency (i.e. the case in paragraph II recurs). Thus, it is possible to correct tuning by means of the push buttons + or − and, if desired, the new channel, with the tuning corrections, can be stored at another address of memory 108, i.e. the operation in case (III) recurs.

It is thus possible to select up to 100 different channels (00 to 99) and to store up to ten of them (in the addresses from 0 to 9 memory 108).

(IV)—By again actuating the push button D, the circuit arrangement returns to the situation previously described herein in paragraph (I) so that it is prepared for indirect station selection.

By then pressing one of the numbered push buttons of control panel 101 (for instance, the push button having the number 3), indirect station selection becomes operative and control unit 104 supplies the following outputs:

the first eight outputs 504–511 are insulated;

the digit corresponding to the actuated push button (for example 3) appears on the third group of four outputs 512–515;

on the thirteenth (516), fourteenth (517) and fifteenth (518) outputs there are present the same signals of the case in paragraph (I), i.e. "1", "1", and a short pulse.

More particularly, by pressing push button D, there is produced a signal at input 519, thus the output of multivibrator 609 returns to zero, light source 603 is extinguished, outputs 516 and 517 become "1" and the outputs of latch 613 are enabled, while buffer 649 is disabled and the outputs 504–507 and 508–511 are insulated. In this condition, by pressing push button 3 of control panel 101, the corresponding number is stored in latch 613 from inputs 500–503 and appears at outputs 512–515.

Under these conditions, the two buffer circuits 109 and 122 are both disabled and all the information to processing unit 128 and to counter 126 is supplied by memory 108 which is enabled to be read, this information being that which was previously stored in the case of paragraph (III) at the selected address, which in this case is the third address. Therefore, the receiving set becomes tuned to channel 12 (whose number is indicated also by display 106), with the tuning correction effected some time before. At this point, a different numbered push button of control panel 101 may be actuated, whereby memory 108 will supply new information to processing unit 128 and to counter 126 in order to obtain the tuning of the channel which has been stored therein.

(V)—The selection of the channels stored in memory 108 may, however, be effected also in the following different way. By pressing the push button + (or the push button −) of control panel 101, counter 113 increases by one unit (or reduces by one unit) the value of the output and, by means of gate 103, buffer 109 is enabled. Moreover, by means of the connection from the output of gate 103 to input 521 of control unit 104, a signal "one" arrives at input OD of latch 613 and the third group of outputs 512–515 of control unit 104 is insulated. Accordingly, memory 108 receives at the address inputs the number formed by counter 113 (for example, the number 5) and supplies to processing unit 128 and to counter 126, in the same manner as in case (IV), the information of the channel stored at the address five.

By successive actuations of the push button + (or −) it is possible to automatically scan sequentially up (or down) the ten addresses of memory 108, i.e. to tune in successively the ten stored channels.

The output of counter 113 no longer stops at seven or at zero, because when the thirteenth output of control unit 104 is at level "1" (i.e. memory 108 is conditioned to be read) gates 112 and 124 supply always signals at level "1", so that gates 115 and 117 are never locked. The number supplied by counter 113 remains at the address input of memory 108 even after the push button + or − has been released (and consequently buffer 109 is disabled again), inasmuch as it is maintained by a special latch conveniently contained in control unit 104.

Said special latch, designated in FIG. 2 by the numeral 560, has its input and output connected at control unit outputs 512, 513, 514 and 515, its IE terminal (Input Enable) connected at control unit input 521, and its OD terminal (Output Disable) connected at the output of gate 650. In this manner, when the push button + (or −) is actuated and there is a signal at level 1 at input 521, special latch 560 holds the number present at outputs 512, 513, 514 and 515 from counter 113, without transferring it to its output. When the push button + or − has been released, and the signal at input 521 becomes zero, the input of special latch 560 is insulated and the signal zero at its OD terminal transfers to the output and then to outputs 512, 513, 514 and 515, and therefore to the addresses of memory 108, the number previously stored from counter 113.

For a clearer explanation, the following Table IV is presented to show a recapitulatory scheme relating to the various cases described hereinabove.

TABLE IV

| case | Outputs of control unit 104 | | Memory 108 set to be: | enabling | Enablings of the circuits | | |
|---|---|---|---|---|---|---|---|
| | 516 | 517 | | | 103 | 109 | 122 |
| II | 0 | 0 | written | no | no | no | yes |
| III | 0 | 1 | written | yes | no | no | yes |
| I-IV-V | 1 | 1 | read | yes | yes | x | no |

(x) is enabled by pressing one of the push buttons + or −.

Hence, the circuit arrangement according to the present invention affords a considerable convenience for the user, since in order to scan the various channels stored in memory 108 it is sufficient to actuate the push buttons + or −.

From the foregoing description, the advantages of the circuit arrangement according to the present invention are clearly apparent; of course, variations in what has been described by way of example will be possible to those skilled in the art, without departing from the scope of the invention.

Thus, for instance, it is possible to send to counter 113 a signal at clock frequency (derived, for example, from a division of the frequency produced by circuit 135) and to cause it to reach the input of counter 113 only when the output of gate 121 is at high level. In this way, as long as the push button + is pressed, the output of counter 113 increases, and as long as the push button − is pressed said output decreases. This occurs up to the value 7 (or down to zero) if a direct selection is carried out (as in case II, correction of tuning); and if an indirect selection is effected (as in case V, automatic rescan), the output of counter 113 will, instead, continue to cyclically vary from 0 to 9 in one or the other direction as long as one maintains the push button + or − pressed.

Therefore, with the circuit arrangement according to the present invention, it is possible to have: a direct station selection by selecting a channel with two digits of control panel 101 and with eventual correction of tuning, as per case (II); a storing of a selected channel, as per case (III); and an indirect station selection, either by selecting a desired cell of memory 108, as per case (IV), or by sequentially scanning the cells of memory 108, as per case (V).

What I claim is:

1. An electronic tuning circuit arrangement comprising:
   (a) a control panel (101) having a plurality of push-buttons or sensors;
   (b) first means (104) actuable by at least one of said push-buttons or sensors to produce digitally coded information identifying respective ones of a plurality of tunable signals;
   (c) second means (128) which receive said digitally coded information and correspondingly supply a respective number (N) in digital form for tuning each signal;
   (d) a counter divider (126) connected to receive the digital output of said second means (128) as a divider, and a clock signal (f) derived from a voltage-controlled oscillator (130) as a dividend, for producing a quotient signal (f/N) representing the clock signal frequency divided by said respective number;

(e) means (133) for comparing said quotient signal (f/N) with a frequency reference oscillation ($f_r$) and producing a resultant signal which is supplied in controlling relation to said voltage-controlled oscillator (130) for causing said oscillator to produce a tuning signal ($f_o$) directly proportional to said respective number;

(f) a memory circuit (108) having a plurality of cells; said first means (104) supplying to said memory circuit (108), and storing in each of said cells, under the action of push-buttons or sensors of said control panel (101) the digitally coded information relating to each of a plurality of preferred signals preselected by the user from among said plurality of tunable signals; said first means (104) under the action of push-buttons or sensors of said control panel (101) selectively supplying to said counter divider (126) from said second means (128) only one desired respective number in digital form for the tuning of each signal, either through digitally coded information directly supplied to said second means (128) from said first means (104) or through digitally coded information supplied from said memory circuit (108) to said second means (128); and (g) third means (113) supplying said counter divider (126) from said second means (128) with said respective number in digital form, by sequentially scanning one after another said cells of said memory circuit (108) and then supplying said second means (128) with the stored digitally coded information obtained from each cell scanned.

2. The circuit arrangement of claim 1, wherein said third means (113) comprises an electronic counter whose outputs are connected through gate means (109) to address inputs of said memory circuit (108), and control logic circuits included in said first means (104) which control said gate means (109) and said memory circuit (108) in such a manner that, when the third means (113) are activated, the digitally coded information received by said second means (128) will only be that stored in the cell scanned of said memory circuit (108).

3. The circuit arrangement of claim 2, wherein said counter (113) is a binary counter operable both up and down.

4. The circuit arrangement of claim 3, wherein said counter (113) supplies a four bit output.

5. The circuit arrangement of claim 3, wherein further logic circuits (115, 117, 120, 121) are provided which are activated by manually actuating a push-button or sensor of said control panel (101) for causing the output of said counter (113) to advance or to recede by one step at a time.

6. The circuit arrangement of claim 3, wherein a clock signal of predetermined frequency is fed to the input of said counter (113) upon manually actuating a push-button or sensor of said control panel (101), the output of said counter progressively increasing (or progressively decreasing) by one step at a time as long as said push-button or sensor is actuated.

7. The circuit arrangement of claim 2, wherein second control logic circuits included in said first means (104) are provided which control, through second gate means (122) connected at the outputs of said electronic counter (113), the utilization of said counter (113) for at least a second function.

8. The circuit arrangement of claim 7, wherein, in being utilized for said second function, said electronic counter (113) supplies digit correction signals to said second means (128) and to said counter divider (126), said digit correction signals being also supplied to said memory circuit (108) for storage in a cell corresponding to stored digitally coded information relating to a tunable signal, whereby the stored digitally coded information relating to a tunable signal and the stored digit correction signals from each cell are supplied to said second means (128) and to said counter divider (126) either by said first means (104) or by said third means (113).

9. The circuit arrangement of claim 8, wherein fourth means (112, 124) are provided for stopping said counter in the stage in which it supplies said digit correction signals, when the count reached by said counter, in counting up and down, corresponds to predetermined numbers, said fourth means (112, 124) being inactive during the stage in which said third means (113) operates for sequentially scanning the cells of said memory circuit (108).

10. The circuit arrangement of claim 8, wherein said counter divider (126) receives twelve bits at its input.

11. The circuit arrangement of claim 8, wherein said plurality of push-buttons or sensors includes at least ten push-buttons or sensors numbered from 0 to 9 which are connected to said first means (104) for producing said digitally coded information, at least one push-button or sensor connected to a control circuit for said counter (113) in order to make it advance or recede on command, a push-button or sensor connected to said first means (104) for supplying to said memory circuit (108) and for storing in each cell the digitally coded information preselected by the user from among the information relating to said plurality of preferred signals, and at least a switching-over push-button or sensor connected to said first means (104) for passing from a direct selection condition, in which said first means directly supplies the digitally coded information for a desired one of the tunable signals to said second means (128) whereby the tuning of a signal is selectable by forming a code number of two digits by means of said numbered buttons and in which said counter (113) may supply the digit correction signals, to an indirect selection condition, in which said first means (104) supplies to said second means (128) the digitally coded information for a desired one of the tunable signals stored in a cell of said memory circuit (108), as well as the stored digit correction signals, in response to actuation of one of said numbered buttons, or in which said third means (113) sequentially scan the cells of said memory circuit for supplying the stored digitally coded information and the digit correction signals.

12. The circuit arrangement of claim 1, wherein said memory circuit (108) is a random access memory with memory cells of twelve bits.

13. The circuit arrangement of claim 1, comprising a double binary-seven segments converter (107) for a double seven-segments display (106), the digitally coded information for said second means (128) being supplied from said first means (104) or from said memory circuit (108) in driving relationship to said converter (107).

* * * * *